(12) United States Patent
Akita et al.

(10) Patent No.: US 7,195,937 B2
(45) Date of Patent: Mar. 27, 2007

(54) METHOD FOR MEASURING WITHSTAND VOLTAGE OF SEMICONDUCTOR EPITAXIAL WAFER AND SEMICONDUCTOR EPITAXIAL WAFER

(75) Inventors: Katsushi Akita, Itami (JP); Masashi Yamashita, Itami (JP); Makoto Kiyama, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 245 days.

(21) Appl. No.: 10/484,001

(22) PCT Filed: Jan. 23, 2003

(86) PCT No.: PCT/JP03/00612

§ 371 (c)(1),
(2), (4) Date: Jan. 9, 2004

(87) PCT Pub. No.: WO03/094223

PCT Pub. Date: Nov. 13, 2003

(65) Prior Publication Data

US 2005/0118736 A1    Jun. 2, 2005

(30) Foreign Application Priority Data

Apr. 30, 2002    (JP) .............................. 2002-128681

(51) Int. Cl.
*H01L 21/66*    (2006.01)
*G01R 31/26*    (2006.01)
*G01N 27/02*    (2006.01)

(52) U.S. Cl. ......................................... 438/17; 324/444
(58) Field of Classification Search .................. 438/19, 438/167, 534, 570, 17; 324/444
See application file for complete search history.

(56) References Cited

U.S. PATENT DOCUMENTS 5,674,778 A * 10/1997 Lee et al. ...................... 438/24

(Continued)

FOREIGN PATENT DOCUMENTS

JP    S62-037969 A    2/1987

(Continued)

OTHER PUBLICATIONS

Ismail et al. An MOS transistor with Schottky source/drain contacts and a self-aligned low-resistance T-gate, Microelectronic Engineering, vol. 35, (1997), p. 361-363.*

*Primary Examiner*—Michael Lebentritt
*Assistant Examiner*—Ron Pompey
(74) *Attorney, Agent, or Firm*—James W. Judge

(57) ABSTRACT

A measurement-facilitating method of measuring the breakdown voltage of a semiconductor epitaxial wafer, and a semiconductor epitaxial wafer whose breakdown voltage is superior are realized. In a method of measuring the breakdown voltage of a semiconductor epitaxial wafer having to do with the present invention, the breakdown voltage between contacts 14 and 18 is measured only through the Schottky contacts, without need for ohmic contacts. Inasmuch as the manufacturing process of forming ohmic contacts is accordingly omitted, the semiconductor epitaxial wafer 10 may be readily used in a breakdown-voltage measurement test. The measurement of the wafer-10 breakdown voltage thus may be readily carried out. Likewise, because the inter-contact breakdown voltage $V_2$ of a wafer 10 can be measured prior to manufacturing a working device from it, unsuitable wafers 10 can be excluded before they are cycled through the working-device fabrication process. Reduction in losses can accordingly be counted upon, in contrast to conventional measuring methods, by which inter-contact breakdown voltage $V_2$ is measured following fabrication of the working devices.

12 Claims, 4 Drawing Sheets

U.S. PATENT DOCUMENTS 6,025,613 A * 2/2000 Bito et al. .................. 257/192
6,177,322 B1 * 1/2001 Derhacobian et al. ...... 438/289
2001/0042872 A1 * 11/2001 Kunihiro et al. ............ 257/280

FOREIGN PATENT DOCUMENTS

JP        H06-232177 A    8/1994

* cited by examiner

METHOD FOR MEASURING WITHSTAND VOLTAGE OF SEMICONDUCTOR EPITAXIAL WAFER AND SEMICONDUCTOR EPITAXIAL WAFER

TECHNICAL FIELD

The present invention relates to semiconductor epitaxial wafers, and to methods of measuring the breakdown voltage of semiconductor epitaxial wafers.

BACKGROUND ART

Recently, even higher output from power FETs (field-effect transistors) that are employed in base stations for mobile communications and in satellite communications has been sought. While one way to realize higher power output from an FET is to raise the operating voltage that is applied to it, owing to the fact that the operating voltage is limited by the gate-to-drain breakdown voltage ($BV_{gd}$) of the FET, measuring the $BV_{gd}$ is a must. Here, "gate-to-drain breakdown voltage" is for example a voltage value defined as, "voltage at which a current of 1 mA per 1 mm gate width flows between gate-drain when a reverse voltage is applied across the two terminals." Then to date, an appropriate film has been built on a wafer as a substrate; the working device including a Schottky contact (gate) and ohmic contacts (source, drain) has been fabricated; and voltage has been applied across the Schottky contact-ohmic contact.

Nonetheless, with methods of measuring the breakdown voltage of the conventional epitaxial semiconductor wafer just described, issues such as the following have persisted. In particular, if after fabricating a working device onto a wafer the wafer is determined not to be up to standard for carrying out the breakdown-voltage measurement, a great deal of time and expense ends up being lost. Moreover, even cases in which the breakdown-voltage measurement is carried out using a readily-fabricated "large device" (a device, larger than a working device, from which measurements are taken), there has been a problem in that with at least two patterning cycles being necessary—patterning for the Schottky contact serving as the gate, and patterning for the ohmic contacts serving as the source/drain—the fabricating process ends up costing a great deal of time and trouble.

DISCLOSURE OF INVENTION

An object of the present invention, brought about in order to resolve the foregoing issues, is thus to realize a measurement-facilitating method of measuring the breakdown voltage of a semiconductor epitaxial wafer, and to realize a semiconductor epitaxial wafer whose breakdown voltage is superior.

A method, involving the present invention, of measuring the breakdown voltage of a semiconductor epitaxial wafer is characterized in that a voltage is applied to a least one pair among a plurality of Schottky contacts formed onto a semiconductor epitaxial wafer and the breakdown voltage across the contacts is measured.

With this method of measuring the breakdown voltage of a semiconductor epitaxial wafer inter-contact breakdown voltage is measured with Schottky contacts only, ohmic contacts being unnecessary. The fact that the manufacturing step of forming ohmic contacts is consequently omitted enables providing for facilitated testing measurement of the breakdown voltage of semiconductor epitaxial wafers. Semiconductor epitaxial wafer breakdown-voltage measurement accordingly may be performed with ease. What is more, because inter-contact breakdown voltage is measured prior to fabricating working devices from wafer, a wafer that does not meet product specification can be excluded before being passed onto working-device fabrication steps. This consequently enables counting on reduction in time and expense losses compared with conventional measuring methods by which inter-contact breakdown voltage is measured after working devices are fabricated.

The surface of the semiconductor epitaxial wafer when the Schottky contacts are to be formed is preferably flat. In forming the Schottky contacts, because a step in which the wafer surface is etched is in this case unnecessary, the time required to produce the contacts can be curtailed.

Likewise, the Schottky contacts are preferably formed onto the same surface. Forming the Schottky contacts using a photolithographic process is in that case facilitated.

The material for the Schottky contacts preferably contains one selected from the group consisting of Au, Pt, Pd, W, Ti, Al and Ni. Thus selecting a material suited to Schottky contacts enables more accurate breakdown-voltage measurement to be carried out.

Before voltage is applied to the contacts, the semiconductor epitaxial wafer surface is preferably cleaned with a cleaning solution containing at least one of: hydrochloric acid, phosphoric acid, ammonia, sulfuric acid, and aqueous hydrogen peroxide. The fact that contamination such as oxide film that forms on the semiconductor epitaxial wafer can in that case be eliminated means that leak current can be suppressed, and that more accurate inter-contact breakdown voltage measurement can be made.

In addition, the structure of the semiconductor epitaxial wafer is preferably one in which the contact layer has been removed from the epitaxial structure for high electron mobility transistors. Measurement substantially equivalent to measuring the breakdown voltage of high election mobility transistors as working devices can in that case be made.

Preferable also is that the material for the semiconductor epitaxial wafer be a compound expressed by: $Al_xGa_yIn_{1-x-y}N$ ($0 \leq x \leq 1$, $0 \leq y \leq 1$, $x+y \leq 1$); $Al_xGa_yIn_{1-x-y}As$ ($0 \leq x \leq 1$, $0 \leq y \leq 1$, $x+y \leq 1$); or $Al_xGa_yIn_{1-x-y}P$ ($0 \leq x \leq 1$, $0 \leq y \leq 1$, $x+y \leq 1$).

It is also preferable that as the Schottky contacts a first contact, a second contact and a third contact, corresponding respectively to a working-device gate, source and drain are formed onto the semiconductor epitaxial wafer. The first contact, second contact and third contact can in that case be assumed to be the gate, source and drain of a working device, whereby the breakdown voltage can be measured with for example the source-to-drain distance, the gate length, etc. put into desired conditions.

Preferable also is that angled portions of the second contact and third contact where they oppose each other have a curved form. Inasmuch as arc discharge arising between the neighboring first contact and second contact can in that case be suppressed, more accurate breakdown-voltage measurement can be carried out.

Preferably, the width of the first contact is 0.8 μm or more, 5 μm or less, and the distance between the first contact and the second contact, and the distance between the first contact and the third contact, is 0.8 μM or more, 20 μm or less. In this way, in cases in which the contacts are large-sized, Schottky contacts can easily be fabricated by direct-contact optical exposure.

Furthermore, a constant current is preferably applied between the first contact and the second contact before voltage is applied across them. Stabilization of the breakdown voltage characteristics between the first contact and the second contact by so-called electrical stress is in that case effected.

A semiconductor epitaxial wafer having to do with the present invention is utilized as a substrate for FETs in which the gate-to-drain distance is $L_1$ and for which a breakdown voltage $V_1$ between the gate and the drain is sought, wherein the semiconductor epitaxial wafer is characterized in that given that the distance between the first contact and the second contact is $L_2$, the breakdown voltage $V_2$ between the first contact and the second contact, measured by the foregoing breakdown-voltage-measurement method satisfies the following relation.

$$V_2 \geq V_1 \times L_2/L_1 \quad (1)$$

With this semiconductor epitaxial wafer, because the breakdown voltage $V_2$ between the first contact and the second contact satisfies relation (1), the breakdown voltage of a working device (FET) fabricated from such a wafer readily turns out to be the sought breakdown voltage $V_1$ or more. Wafers whose breakdown voltage is superior can consequently be obtained.

BEST MODE FOR CARRYING OUT THE INVENTION

Figure 1:
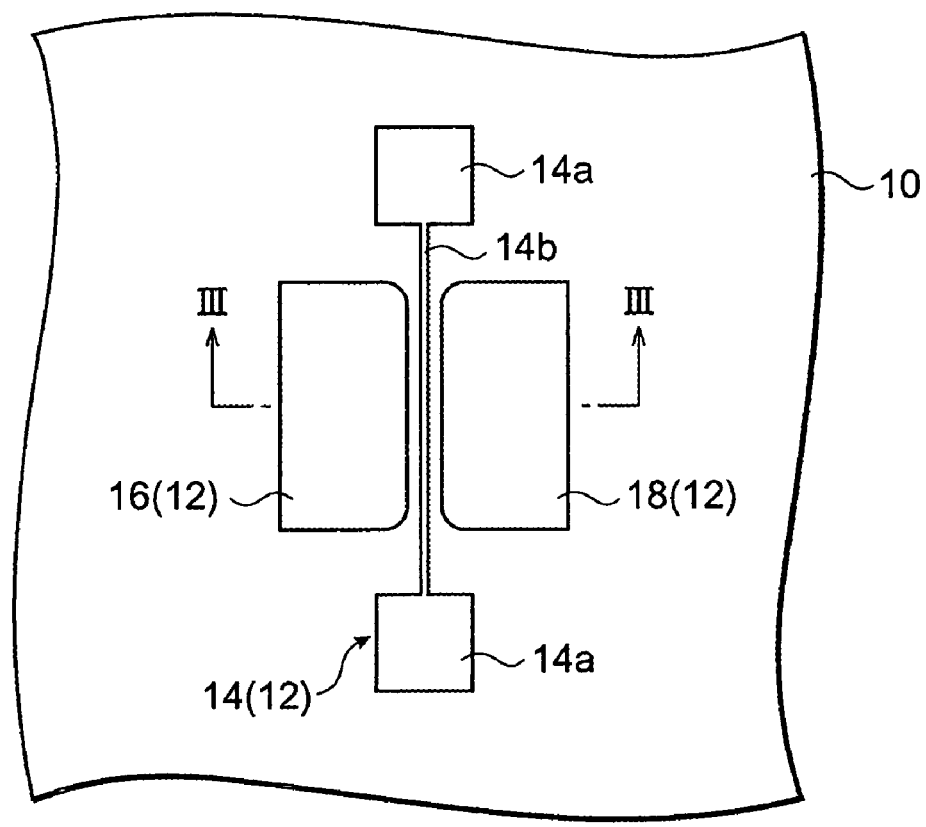
FIG. 1 is a plan view depicting a wafer involving an embodiment of the present invention.
Figure 2A:
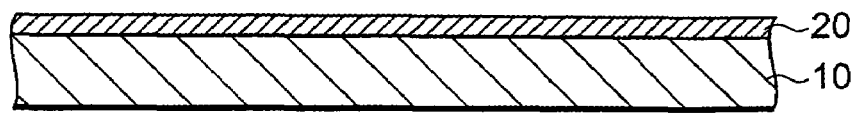
FIG. 2 is diagrams representing steps in the course of fabricating the wafer depicted in FIG. 1.
Figure 2B:
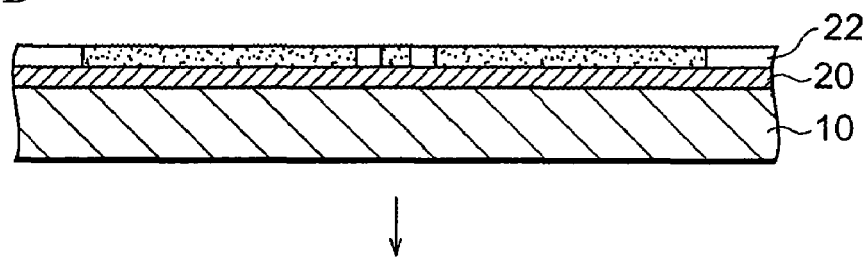
Figure 2C:
Figure 2D:
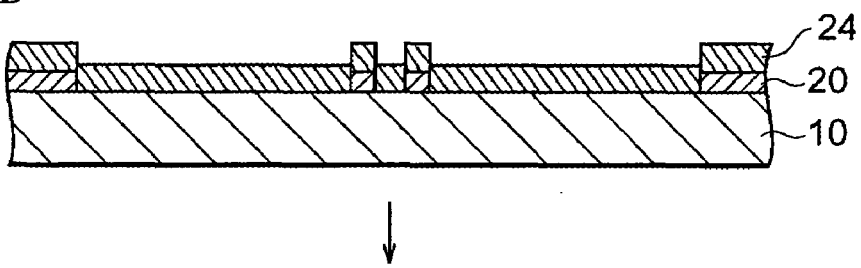
Figure 2E:
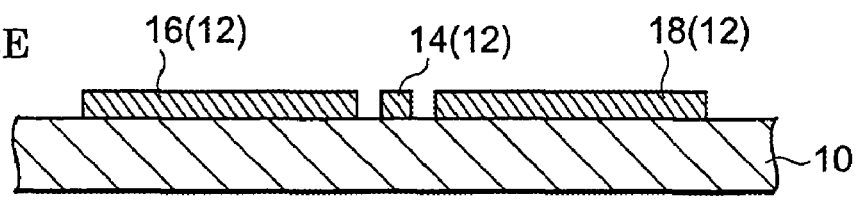

With reference to the attached drawings a method, having to do with the present invention in a most preferred embodiment, of measuring the breakdown voltage of a semiconductor epitaxial wafer will be described below in detail. FIG. 1 is a plan view representing a semiconductor epitaxial wafer used for breakdown-voltage measurement.

As shown in FIG. 1 three Schottky contacts 12 are formed onto the semiconductor epitaxial wafer (referred to simply as "wafer" hereinafter) 10. With its uppermost layer (cap layer) being an n-type GaN epitaxial layer the wafer 10 is fabricated by a suitably chosen semiconductor manufacturing process to have a working-device field-effect transistor (FET). The topside of the wafer 10 is approximately planar, and the Schottky contacts 12 are formed on this same surface. (The Schottky contacts 12 are formed onto the wafer 10 by a method that will be described later.)

The Schottky contacts 12 assume forms corresponding to the gate, source and drain of the FET that is the working device. In particular, Schottky contact 14 (first contact) has a form corresponding to the gate, while Schottky contact 16 (second contact) and Schottky contact 18 (third contact) have forms corresponding respectively to the source and drain.

Schottky contact 14 corresponding to the gate is configured with two separated square contact portions 14a, and a rectilinear contact portion 14b that interconnects the square contact portions 14a, 14a. The width of the rectilinear contact portion 14b (corresponding to the FET gate length; length in the side-to-side direction in the figure) is 1 μm; likewise the length of the rectilinear contact portion 14b (corresponding to the FET gate width; length in the up-and-down direction in the figure) is 100 μm. Schottky contact 16 and Schottky contact 18 corresponding respectively to the source and drain are in opposition flanking the rectilinear contact portion 14b of Schottky contact 14, and have an approximately rectangular form in which the long edges parallel the lengthwise direction of the Schottky contact 14. In particular, Schottky contact 16 and Schottky contact 18 are approximately symmetrical with respect to the rectilinear contact portion 14b of Schottky contact 14.

Among the corners of Schottky contact 16 and Schottky contact 18, those on the sides where the like contacts 16, 18 oppose each other are given a smooth curved contour, and the lateral surface of the corners is approximately the same as the curved face of a circular cylindrical surface. Thus contouring the corners of Schottky contact 16 and Schottky contact 18—in contrast to the situation in which the corners are right angles—provides for suppressing the occurrence of arc discharge arising between the contacts 14, 18 (or 16). In addition, that fact that the Schottky contacts 12 are formed so as to correspond to the gate, source and drain of a working device means that the breakdown voltage measured will be a value close to the inter-contact breakdown voltage of a working device.

The three Schottky contacts 12 are, moreover, constituted from Au. It should be understood that other than Au, whichever of Pt, Pd, W, Ti, Al or Ni can be selected as a material for the Schottky contacts, which likewise may be an alloy that includes whichever of Pt, Pd, W, Ti, Al or Ni. Thus selecting a material suited to the Schottky contacts 12 provides for performing the later-described breakdown-voltage measurement the more accurately. The Schottky contacts 12 are lent an appropriately multilayer structure, in which case the material for each layer is selected from the abovementioned materials. These Schottky contacts 12 are formed onto the wafer 10 by a lift-off process. A method of forming the Schottky contacts 12 onto the wafer 10 will be explained while reference is made to FIG. 2.

Initially a negative resist 20, which is a photosensitive resin, is coated onto the entire surface of the wafer 10; (see FIG. 2A). A quartz mask 22 that has been patterned (stippled areas in the figure) with chrome into the form of the Schottky contacts described above is then laid onto the coated resist 20, and the wafer 10 and the quartz mask 22 are brought into contact; (see FIG. 2B) and exposed to ultraviolet rays with a mercury lamp (not illustrated) from above the quartz mask 22. By bringing into contact and optically exposing the wafer 10 and the quartz mask 22 in this way—by adopting the so-called contact exposure technique—the wafer 10 can be exposed with facility. The portions of the resist 20 that have been exposed thereby become insoluble. Subsequently the quartz mask 22 is removed and at the same time, the wafer 10 is developed, transferring onto it a pattern that is the reverse of the pattern on the quartz mask 22; (see FIG. 2C). On the wafer 10 that has been formed in this way—that has been formed with the reverse-patterned resist 20—an Au layer 24 is built by EB vapor deposition; (see FIG. 2D). Then lastly, by removing the resist 20 and the Au layer built on the resist 20 (the so-called lift-off process), Schottky contacts 12 of the desired shape are formed; (see FIG. 2E).

Schottky contacts 12 are formed on the surface of the wafer 10 by putting it through a Schottky-contact 12 fabrication process (photolithography operations) such as in the foregoing. What is particularly significant here is that etching is not carried out on the wafer 10 surface in fabricating the Schottky contacts 12. The fact that an etching process, which would require a great deal of time, is thus not necessary serves to shorten the Schottky-contact 12 fabrication time.

A method of measuring the breakdown voltage of Schottky contacts 12 formed in the foregoing manner will next be explained. Here, "breakdown voltage" in the present embodiment is, wherein a voltage at which a dc current flows from Schottky contact 18 to Schottky contact 14 has been applied, the voltage per 1 mm length of Schottky contact 14 at which a current of 1 mA flows between Schottky contact 14 and Schottky contact 18. That is, breakdown voltage here signifies, in the working device (FET), "voltage per 1 mm gate width when a current of 1 mA flows between gate-drain." Accordingly, if for example the length of Schottky contact 14 (gate width of the working device) is 100 μm, the voltage when a current of $10^{-4}$ A flows between Schottky contact 14 (corresponding to the working-device gate) and Schottky contact 18 (corresponding to the working-device drain) would be the "breakdown voltage."

Figure 3:
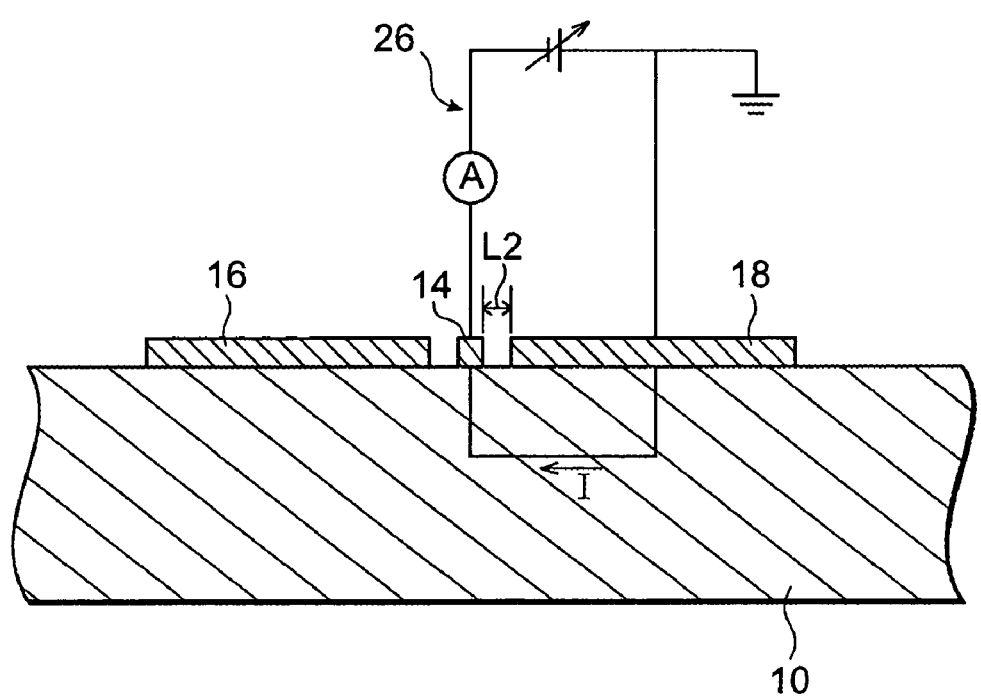
FIG. 3 is a section view through line III—III in FIG. 1.

As illustrated in FIG. 3, Schottky contact 18 is grounded, and meanwhile a dc circuit 26 for applying a negative voltage to Schottky contact 14 is formed. Then prior to measuring breakdown voltage, a constant current of 10 μA is applied for a 10-second interval. While it is known that flowing a current generally enhances breakdown voltage, in this way flowing a constant current in the circuit 26 to impart electrical stress from Schottky contact 18 to Schottky contact 14 stabilizes the breakdown voltage characteristics. The breakdown voltage is subsequently measured by flowing a dc current in the circuit 26.

Inasmuch as in this situation the current flowing from the Schottky contact 18 to the wafer 10 is in the Schottky-contact forward direction in which the contact resistance is small, the current flows smoothly. Particularly significant is that Schottky contact 18, corresponding to the drain of a working device, functions as does an ohmic contact. This means that measurement of Schottky-contact 14 breakdown voltage is made without forming ohmic contacts onto the wafer 10. Accordingly, the wafer 10 having the contacts 12 can be readily fabricated, in contrast to the case with breakdown-voltage measurement techniques to date, which have dictated that ohmic contacts be formed onto the wafer 10.

Figure 4:
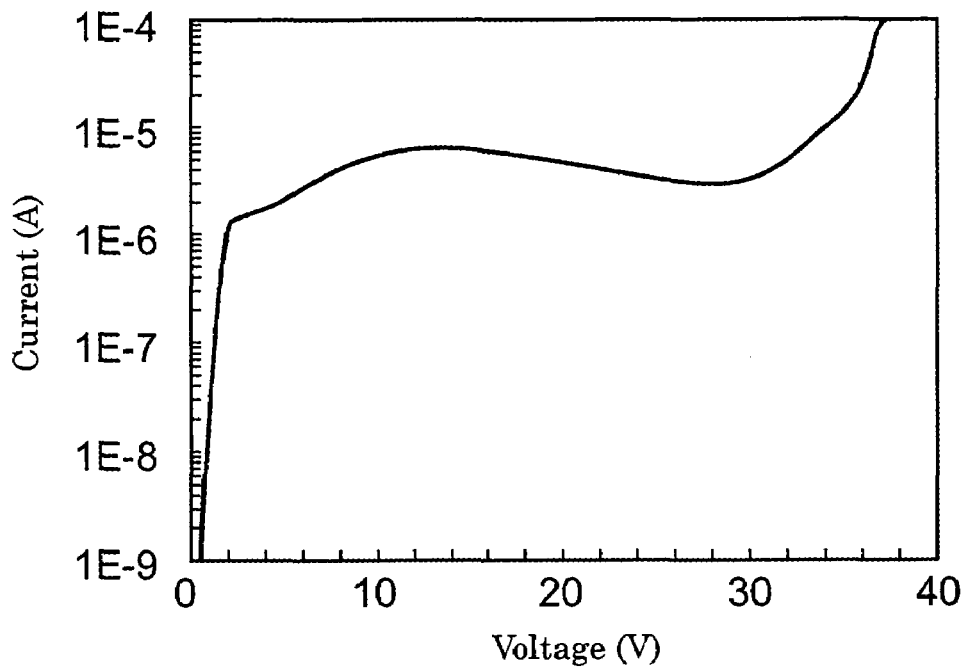
FIG. 4 is a graph illustrating the relationship between voltage and current in a circuit.

FIG. 4 then is a graph for a situation in which the voltage in the circuit 26 was increased gradually from 0 V. The horizontal axis in the graph is the value of the applied voltage, while the vertical axis is the value of the current flowing between Schottky contact 14 and Schottky contact 18. As is clear from the graph, the current rose steeply until a voltage of about 2 V Although the current thereafter ought to have saturated inasmuch as it was in the Schottky reverse direction, a definite saturation value could not be confirmed. This was an impairment to measuring the breakdown voltage with satisfactory accuracy. Given the circumstances, the inventors discovered after concerted investigation that not being able to confirm a clear saturation in the current value was due to leakage current, and that what turned out to be the causative factor behind the leakage current, oxide film on the wafer surface between the contacts 12, should be cleared with hydrochloric acid.

Figure 5:
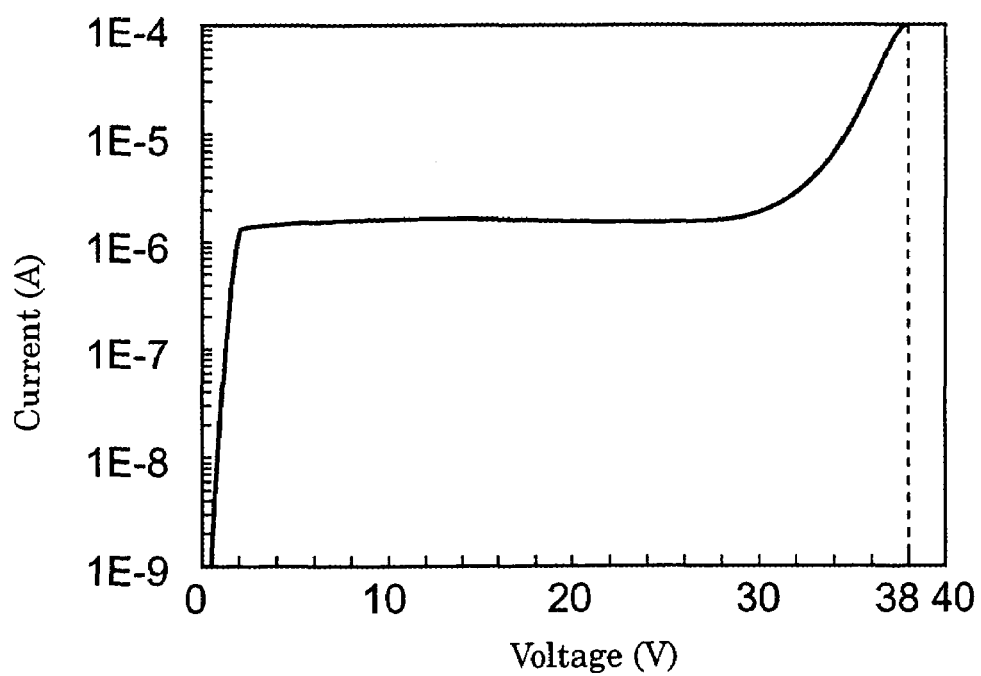
FIG. 5 is a graph illustrating the relationship between voltage and current in a circuit following oxide-film removal.

Accordingly, after eliminating with hydrochloric acid the oxide film on the wafer surface between the contacts 12, the measurement was made once more. A graph of the results of this measurement is plotted in FIG. 5. The horizontal and vertical axes are the same as in FIG. 4. As is clear from this graph, the current does manifest a definite saturation value, and the puncture voltage is 32 V or so. Then from reading the voltage (breakdown voltage) for when a current of $10^{-4}$ A—because the length of Schottky contact 14 is 100 μm—flows between Schottky contact 14 and Schottky contact 18, it is evident that value is 38 V or so. Measurement of the breakdown voltage is in this way finished.

Subjecting the wafer 10 on which the contacts 12 are formed to the breakdown-voltage measurement test as explained in detail in the foregoing measures the breakdown voltage between the contacts 14 and 18 through Schottky contacts only, without need for ohmic contacts. The fact that the manufacturing process of forming ohmic contacts is accordingly omitted enables the contacts 12 to be created through only a single-cycle photolithography process. Inasmuch as the wafer 10 may thereby be readily used in the breakdown-voltage measurement test, the measurement of the wafer 10 breakdown voltage may be readily carried out. By the same token, because the inter-contact breakdown voltage of a wafer 10 can be measured prior to manufacturing a working device from it, unsuitable wafers 10 can be excluded before they are cycled through the working-device fabrication process. Reduction in losses can accordingly be counted upon, in contrast to conventional measuring methods, by which inter-contact breakdown voltage is measured following fabrication of the working devices.

At this point, a technique of measuring breakdown voltage by means of contacts that are larger-sized than the size desired in a FET will be explained.

The fact that in general breakdown voltage of a working device is approximately inversely proportional to the distance over the gate-drain interval is known. Consequently, wherein the gate-drain distance in and breakdown voltage desired in an FET are $L_1$ and $V_1$, the distance $L_2$ (referring to FIG. 3), and the breakdown voltage $V_2$, between Schottky contact 14 and Schottky contact 18 on a wafer 10 subjected to breakdown-voltage measurement may be expressed by the following relational formula.

$$V_2/L_2 \approx V_1/L_1 \quad (1)$$

Therefore, in order that the desired FET breakdown voltage satisfy at least $V_1$, the breakdown voltage $V_2$ between Schottky contact 14 and Schottky contact 18 should satisfy relation (2) below.

$$V_2 \geq V_1 \times L_2/L_1 \quad (2)$$

By the breakdown voltage $V_2$ then satisfying relation (2), the FET breakdown voltage readily turns out to be the sought breakdown voltage $V_1$ or more. This means that the breakdown-voltage measurement can be conducted with ease, because the breakdown voltage $V_1$ for a working device can be tested for even in cases in which large-sized contacts 12 are formed by the more convenient direct-contact optical exposure technique. As far as dimensions that facilitate fabrication by the contact-exposure technique are concerned, the width of the first contact should be 0.8 μm or more, 5 μm or less; and the distance between the first contact and the second contact, and the distance between the first contact and the third contact should be 0.8 μm or more, 20 μm or less.

The present invention is not limited to the embodiment described above, in that various modifications are possible. For example, the cleaning solution for clearing the oxide film from the wafer surface is not limited to hydrochloric acid, but as long as it removes oxide film, may be phosphoric acid, ammonia, sulfuric acid, aqueous hydrogen peroxide, or may be a solution containing a plurality of these liquids in a mixture. Likewise, the wafer material is not limited to GaN, but may be expressed by whichever of: $Al_xGa_yIn_{1-x-y}N$ ($0 \leq x \leq 1$, $0 \leq y \leq 1$, $x+y \leq 1$); $Al_xGa_yIn_{1-x-y}As$ ($0 \leq x \leq 1$, $0 \leq y \leq 1$, $x+y \leq 1$); or $Al_xGa_yIn_{1-x-y}P$ ($0 \leq x \leq 1$, $0 \leq y \leq 1$, $x+y \leq 1$) such as, for example, InP or AlGaN.

Furthermore, Schottky contact 16 and Schottky contact 18 may have approximately the same positional relationship to Schottky contact 14, and either the one or the other Schottky contact 16 or Schottky contact 18 may be formed onto the wafer 10, because it will lead to the same results for the breakdown-voltage measurement. The applied voltage, moreover, may be an ac voltage.

In addition, the wafer 10 may be a structure in which the contact layer (an n-type GaAs layer for example) is left out from the epitaxial wafer structure for a GaAs-type high-electron mobility transistor. In this case, prior to fabricating the high-electron mobility transistor as a working device, a measurement that is substantially the same as the breakdown voltage measurement for the high-electron mobility transistor can be made.

INDUSTRIAL APPLICABILITY

In terms of the present invention, a measurement-facilitating method of measuring the breakdown voltage of a semiconductor epitaxial wafer, and a semiconductor epitaxial wafer whose breakdown voltage is superior are realized.

The invention claimed is:

1. A method of measuring the breakdown voltage of a semiconductor epitaxial wafer, comprising:
   a step of applying a voltage to a least one pair of contacts among a plurality of Sohottky contacts formed onto a semiconductor epitaxial wafer; and
   a step of measuring the breakdown voltage across the contacts prior to or during fabrication of a semiconductor device on said semiconductor epitaxial wafer.

2. A semiconductor epitaxial wafer breakdown-voltage measurement mothod as set forth in claim 1, wherein in forming the Schottky contacts the semiconductor epitaxial wafer is superficially flat.

3. A semiconductor epitaxial wafer breakdown-voltage measurement method as set forth in claim 2, wherein the Schottky contacts are formed onto the same surface.

4. A semiconductor epitaxial wafer breakdown-voltage measurement method as set forth in claim 1, wherein the Schottky contact materially contains one selected from the group consisting of Au, Pt, Pd, W, Tl, Al and Ni.

5. A semiconductor epitaxial wafer breakdown-voltage measurement method as set forth in claim 1, wherein before said step of applying a voltage, the semiconductor epitaxial wafer is superficially cleaned with a cleaning solution containing at least one of: hydrochloric acid, phosphoric acid, ammonia, sulfuric acid, and hydrogen peroxide.

6. A semiconductor epitaxial wafer breakdown-voltage measurement method as set forth in claim 1, wherein the structure of the semiconductor epitaxial wafer is a high-electron-mobility-transistor device epitaxial structure in which a layer for the device contacts has been omitted from the transistor epitaxial structure.

7. A semiconductor epitaxial wafer breakdown-voltage measurement method as set forth in claim 1, wherein the semiconductor epitaxial wafer materially is a compound expressed by: $Al_xGa_yIn_{1-x-y}N$ ($0 \leq x \leq 1, 0 \leq y \leq 1$, $x+y \leq 1$); $Al_xGa_yIn_{1-x-y}AS$ ($0 \leq x \leq 1, 0 \leq y \leq 1$, $x+y \leq 1$); or $Al_xGa_yIn_{1-x-y}P$ ($0 \leq x \leq 1, 0 \leq y \leq 1, x+y \leq 1$).

8. A semiconductor epitaxial wafer breakdown-voltage measurement method as set forth in claim 1, wherein as the Schottky contacts, a first contact, a second contact and a third contact, corresponding respectively to a working-device gate, source and drain, are formed onto the semiconductor epitaxial wafer.

9. A semiconductor epitaxial wafer breakdown-voltage measurement method as set forth in claim 8, wherein angled portions of said first contact and second contact where they oppose each other have a curved form.

10. A semiconductor epitaxial wafer breakdown-voltage measurement method as set forth in claim 8, wherein the first contact is 0.8 µm or more, 5 µm or less in width; and the distance separating the first contact and the second contact, and the distance separating the first contact and the third contact, is 0.8 µm or more, 20 µm or less.

11. A semiconductor epitaxial wafer breakdown-voltage measurement method as set forth claim 8, wherein ti constant current is applied between the first contact and the second contact before step of applying a voltage.

12. A semiconductor epitaxial wafer utilized as a substrate for FETs in which the gate-to-drain distance is $L_1$ and for which the breakdown voltage $V_1$ between the gate and the drain is sought, wherein the distance separating the first contact and the second contact is $L_2$, the breakdown voltage $V_2$ between the first contact and the second contact, measured by the breakdown voltage-measurement method set forth in claim 8 satisfies the following relation (1)

$$V_2 \leq V_1 \times L_2/L_1 \qquad \ldots (1).$$

* * * * *

UNITED STATES PATENT AND TRADEMARK OFFICE
CERTIFICATE OF CORRECTION

PATENT NO. : 7,195,937 B2 Page 1 of 1
APPLICATION NO. : 10/484001
DATED : March 27, 2007
INVENTOR(S) : Katsushi Akita, Masashi Yamashita and Makoto Kiyama It is certified that error appears in the above-identified patent and that said Letters Patent is hereby corrected as shown below:

In Claim 1, column 7, line 34, "Sohottky" should read --Schottky--.

In Claim 2, column 7, line 40, "mothod" should read --method--.

In Claim 4, column 7, line 49, "TI" should read --Ti--.

In Claim 11, column 8, line 36, "wherein ti" should read --wherein a--.

In Claim 12, column 8, line 45, "breakdown voltage-measurement method" should read --breakdown-voltage-measurement method--.

Signed and Sealed this

Fourth Day of December, 2007

JON W. DUDAS
*Director of the United States Patent and Trademark Office*